US011031554B2

(12) United States Patent
Charpin-Nicolle et al.

(10) Patent No.: US 11,031,554 B2
(45) Date of Patent: Jun. 8, 2021

(54) METHOD FOR MANUFACTURING A PASS-THROUGH DEVICE

(71) Applicant: Commissariat A L'Energie Atomique et aux Energies Alternatives, Paris (FR)

(72) Inventors: Christelle Charpin-Nicolle, Fontanil-Cornillon (FR); Remy Gassilloud, Saint Laurent du Pont (FR); Alain Persico, St Martin d'Heres (FR)

(73) Assignee: Commissariat A L'Energie Atomique et aux Energies Alternatives, Paris (FR)

(*) Notice: Subject to any disclaimer, the term of this patent is extended or adjusted under 35 U.S.C. 154(b) by 0 days.

(21) Appl. No.: 16/226,708

(22) Filed: Dec. 20, 2018

(65) Prior Publication Data
US 2019/0252611 A1  Aug. 15, 2019

(30) Foreign Application Priority Data

Dec. 21, 2017  (FR) ..................................... 17 62757

(51) Int. Cl.
*H01L 45/00* (2006.01)
*H01L 21/768* (2006.01)
*G11C 11/56* (2006.01)

(52) U.S. Cl.
CPC .......... *H01L 45/1608* (2013.01); *G11C 11/56* (2013.01); *H01L 21/76877* (2013.01); *H01L 45/08* (2013.01); *H01L 45/085* (2013.01); *H01L 45/122* (2013.01); *H01L 45/1233* (2013.01); *H01L 45/1246* (2013.01); *H01L 45/1253* (2013.01); *H01L 45/146* (2013.01); *H01L 45/16* (2013.01); *H01L 45/1683* (2013.01)

(58) Field of Classification Search
CPC .................................................. H01L 45/1608
USPC .............................................. 257/4; 438/666
See application file for complete search history.

(56) References Cited

U.S. PATENT DOCUMENTS 6,117,720 A      9/2000  Harshfield
2006/0223309 A1* 10/2006  Ho ..................... H01L 21/76808
                                                                 438/652

(Continued)

FOREIGN PATENT DOCUMENTS

CN         102412195         4/2012

OTHER PUBLICATIONS

European Office Action dated Jun. 29, 2020 in European Patent Application No. 18213769.5, citing document AA therein, 4 pages.

(Continued)

*Primary Examiner* — Ajay Arora
(74) *Attorney, Agent, or Firm* — Oblon, McClelland, Maier & Neustadt, L.L.P.

(57) ABSTRACT

The present invention relates to a method for producing a via through a base layer of a microelectronic device, the method including formation of a hole leading to at least one first face of the base layer and filling the hole by at least one first filling material. The method also includes at least partially removing the at least one first filling material over a depth from the first face of the base layer, the depth being strictly less than a thickness dimension of the hole, so as to produce a hollow portion. Further, method includes a second step of at least partially filling the hollow portion by at least one second filling material.

14 Claims, 7 Drawing Sheets

(56) References Cited

U.S. PATENT DOCUMENTS

Figure 1:
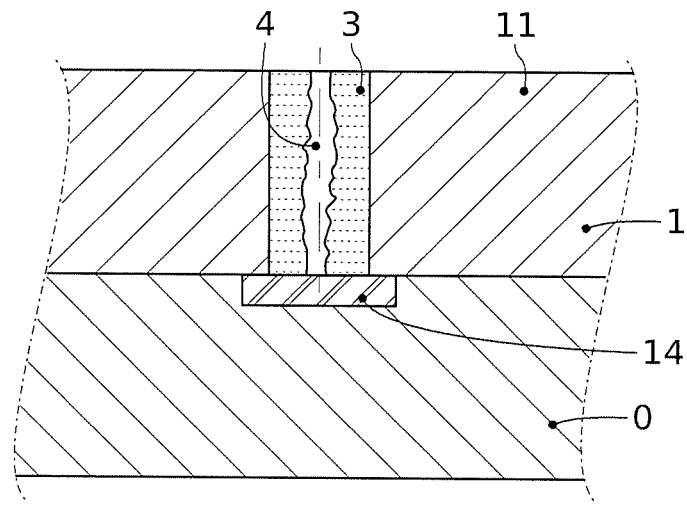

| | | |
|---|---|---|
| 2007/0037316 A1 | 2/2007 | Manning et al. |
| 2007/0049017 A1* | 3/2007 | Hsieh ................ H01L 21/76877 |
| | | 438/672 |
| 2008/0128853 A1 | 6/2008 | Choi et al. |
| 2009/0035514 A1 | 2/2009 | Kang et al. |
| 2011/0031461 A1 | 2/2011 | Kang et al. |
| 2011/0081762 A1 | 4/2011 | Choi et al. |
| 2012/0267788 A1 | 10/2012 | Hong et al. |
| 2012/0280199 A1 | 11/2012 | Takagi |
| 2013/0075682 A1 | 3/2013 | Lee |
| 2014/0011335 A1 | 1/2014 | Lee |
| 2017/0338148 A1 | 11/2017 | Shusterman et al. |

OTHER PUBLICATIONS

French Preliminary Search Report dated Aug. 31, 2018 in French Application 17 62757, filed on Dec. 21, 2017 (with English translation of categories of cited documents & Written Opinion).

Peng, W., et al., "Elimination of Tungsten-Voids in Middle-of-Line Contacts for Advanced planar CMOS and FinFET Technology", Advanced Semiconductor Manufacturing Conference, ASMC 2016, pp. 160-163.

Gao, L., et al., "Tungsten voids improvement by optimizing MOCVD-TiN barrier layer plasma treatment at 28 nm technology node", China Semiconductor Technology, CSTIC 2017, pp. 1-3.

Extended European Search Report dated Aug. 12, 2019 in European Patent Application No. 18213769.5 (with English translation of Category of Cited Documents), citing documents AA and AB therein, 4 pages.

\* cited by examiner

METHOD FOR MANUFACTURING A PASS-THROUGH DEVICE

FIELD OF THE INVENTION

The present invention relates to electronic devices equipped with vias.

By microelectronic device, this means any type of device produced with microelectronic means.

These devices comprise in particular, in addition to devices with a purely electronic purpose, micromechanical or electromechanical devices (MEMS, NEMS, etc.) as well as optical or optoelectronic devices (MOEMS, etc.).

A non-limiting application of the invention is the technology of memory devices and more specifically resistive non-volatile memory devices. In particular, OXRAM memories are desired. OxRRAM ("Oxide-Based Resistive Random Access Memories")-type resistive memories, typically comprising a metal oxide layer, are studied for non-volatile applications, with the aim of replacing Flash-type memories. They have, in particular, the advantage of being compatible with the BEOL ("Back-End Of Line") method of the CMOS ("Complementary Metal-Oxide-Semiconductor") technology. OxRRAM resistive memories are devices comprising, in particular, a metal oxide layer arranged between two electrodes. The electrical resistance of such devices can be modified by writing and deleting operations. These writing and deleting operations make it possible to make the OxRRAM resistive memory device pass from an HRS ("High Resistive State") to an LRS ("Low Resistive State") and vice versa.

STATE OF THE ART

The vias, in particular the tungsten plugs, have had a significant rise in the microelectronics sector insofar as they make it possible for an electrical connection along the thickness of the stacks of layers of devices, enabling for example in that, three-dimensional architectures.

The systemic trend of microelectronics to reduce the dimensions of the components however thus makes the qualitative production of vias more difficult. Thus, the diameters of the vias are sometimes very small compared with the height thereof, such that the shape ratios have become increased; in such situations, the filling of the vias becomes problematic. FIG. 1 illustrates, in a longitudinal cross-section, a via 3 for example made of tungsten according to the state of the art through a layer 1 of a substrate 0. Non-filled zones are noted, i.e. voids 4, in the central part of the via, zones constituting induced defects (or inherent to the deposition method (in particular, by chemical vapour deposition (CVD)) and could alter the efficacy of the via, in particular in terms of electrical reliability.

Figure 2:
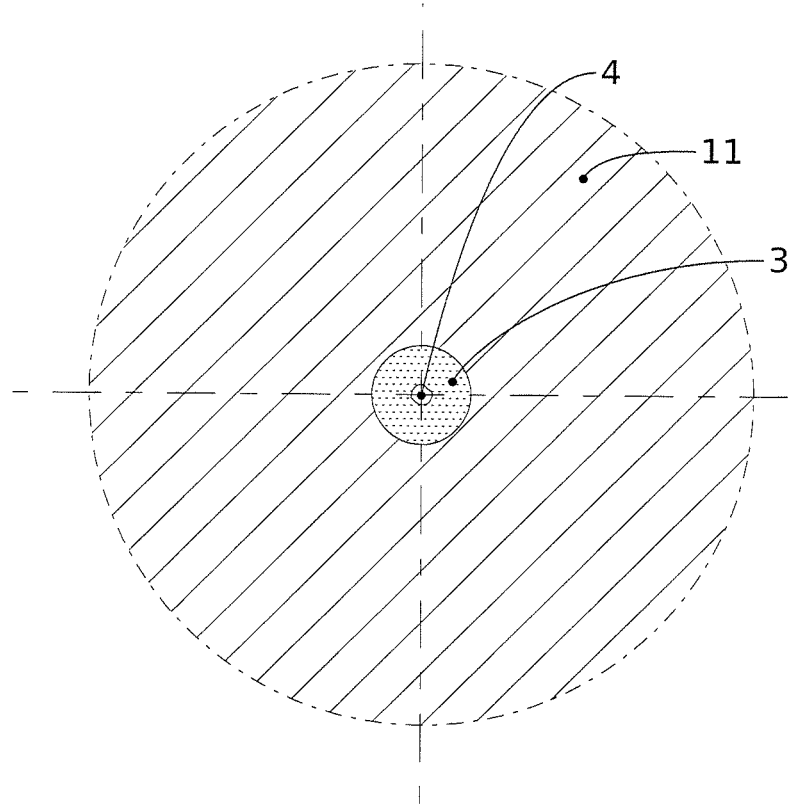

FIG. 2 shows the upper end of a via 4 carrying such a surface defect, in a non-limiting case of via circular cross-section.

There is therefore a need to propose a device and a method for the production thereof making it possible to improve the techniques known to date, in particular regarding the presence of defects, such as voids, in the vias. There is also a need to improve the production of memory-type microelectronic devices.

SUMMARY OF THE INVENTION

According to a first aspect, the invention relates to a method for producing a via through a base layer of a microelectronic device, comprising a formation of a hole leading to at least one first face of the base layer and a filling of the hole by at least one first filling material.

Preferably and advantageously, this embodiment method comprises an at least partial removal of the filling material over a depth from the first face of the base layer, the depth being strictly less than a thickness dimension of the hole, so as to produce a hollow portion, and in that it comprises a second filling, at least partial, of the hollow portion by at least one second filling material.

Thus, the filling of the hollow portion is done under more favourable conditions insofar as the depth of this second filling is reduced. This favours the quality of this portion of the via, in particular in terms of numbers of defects or voids of this part. Possibly, the filling of the hollow portion is the opportunity to selecting a second material, different from the first material.

Advantageously, the second filling comprises the formation of an electrically conductive layer immediately above the first filling, the latter preferably being configured to form an electrically conductive element. This arrangement makes it possible to arrange an electrically conductive layer deposited by the second filling under better conditions so as to obtain, ultimately, an electrical contact surface of better quality. For example, this can be used to arrange a better electrical interface with superposed layers, in particular an active layer. In this context, the removal and the second filling are therefore used, non-exclusively, to produce an overall conductive element of better electrical contact quality with another component.

In optional advantageous embodiments, the removal is configured such that the hollow portion has a shape ratio less than that of the initial hole. The shape ratio (ratio equal to depth/width of the cavity in question) is thus lower for the hollow portion that it was for the hole itself. It can possibly take the width of the cavity at the level of the open end thereof as a calculation base. The depth of the removal makes it possible to adjust this shape ratio, in particular according to the kinetics of an engraving. The smaller the shape ratio is, the more the possible voids are limited in the filling of the hollow portion. It can, for example, be less than 2, even less than 1, and potentially up to 0.25. It can achieve a situation wherein there are no more voids during the filling, which is the most favourable, non-limiting case.

The invention also touches upon a device obtained by this method. It can comprise several holes forming the subject of the method of the invention. It can be used to form a conductive elements, such as an electrode, which can be flush on the first face of the substrate, and/or form a stack comprising a conductive element forming an lower electrode and a layer of conductive state-changing material.

According to another preferred embodiment aspect of the invention, a microelectronic device is presented, comprising a base layer having a hole leading at least to a first face of the base layer and a conductive element situated in the hole and formed by at least one first filling material.

Advantageously, this device is such that it comprises a second element situated in the hole above the first element in the direction of the first face and formed by at least one second filling material, the first material forming at least one part of a first electrode, the at least one second material comprising a conductive state-changing material layer.

Another aim of the present invention relates to a microelectronic system comprising a plurality of devices according to the invention.

The invention also relates to a method for producing a microelectronic device equipped with an active layer.

INTRODUCTION OF THE DRAWINGS

Figure 8:
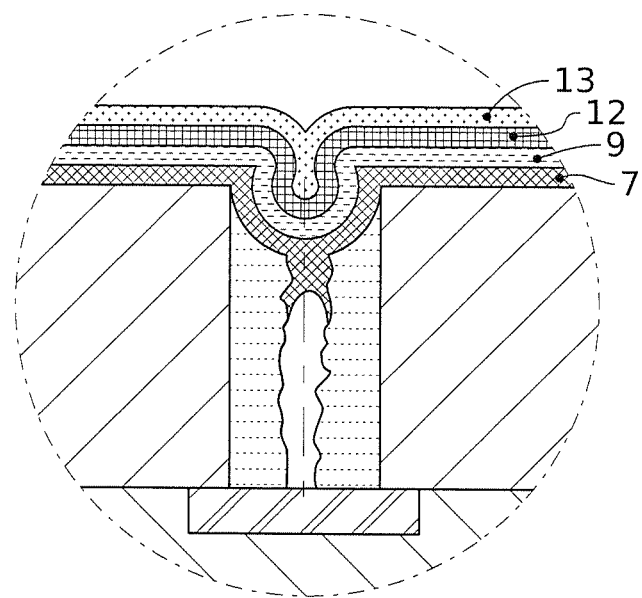
Figure 9:
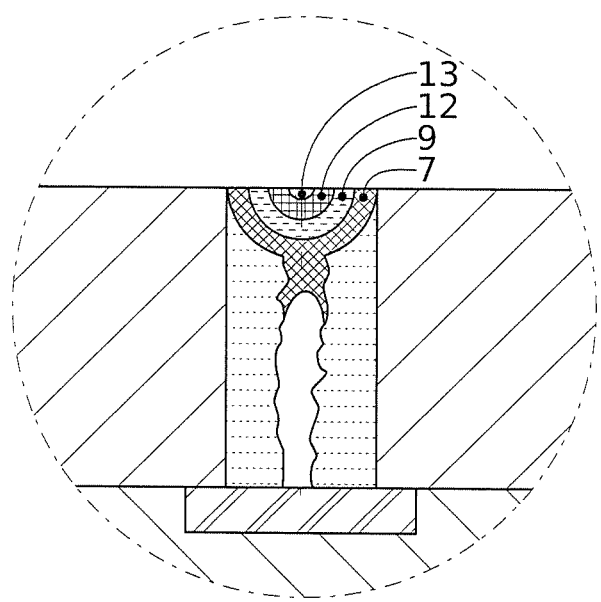

Other characteristics, aims and advantages of the present invention will appear upon reading the following detailed description, regarding the appended drawings, given as a non-limiting example and on which:

FIG. 1 has a cross-sectional view of a microelectronic device with vias provided with defects;

FIG. 2 gives a top view illustration of it;

FIGS. 3 to 7 show production steps of a via according to the invention;

FIGS. 8 and 9 give a variant of via obtained;

FIGS. 10 to 16 show another embodiment of the via, with a device at least partially formed in the inner volume thereof.

The drawings are given as examples and are not limiting of the invention. They constitute schematic representations of principle, intended to facilitate the understanding of the invention and are not necessarily to the scale of practical applications, in particular regarding the thickness of the different layers illustrated.

DETAILED DESCRIPTION

Before entering into the detail of different embodiments, in particular in reference to the figures subsequently introduced, are stated below different, purely optional and non-limiting characteristics that embodiments can have individually or according to all combinations of one another:

- the removal is configured such that the hollow portion 5 has a shape ratio less than that of the hole 2;
- the removal is configured such that the hollow portion 5 has a shape ratio less than or equal to 2 and preferably less than or equal to 1;
- the removal comprises an engraving; this can be isotropic in particular if a cap profile of the hollow portion is desired; it can also be anisotropic, in particular if the first material is desired to be removed completely over the depth of the hollow portion;
- the at least one first filling material comprises a material different from the at least one second filling material;
- the at least one second material comprises at least two successive layers of materials, different from one another;
- possibly, the at least one second material comprises at least one electrically conductive layer; it can comprise a plurality of stacked electrically conductive layers; the at least one electrically conductive layer is advantageously arranged immediately above the first element; preferably, the first element forms an electrically conductive assembly (in this context, the at least one first filling material is electrically conductive) and the at least one electrically falls into the electrical continuity of the first element; in this context, a better electrical contact can be obtained. In particular, the second filling is done with a hollow portion shape ratio more favourable than that of the hole, if although the electrically conductive layer(s), starting or forming all of the second filling, are deposited under better conditions, favouring the absence of any voids in the layers thereof. Thus, in this context, the first filling is completed by a second filling improving the electrical contact quality. Possibly, the second filling can consist of one or more electrically conductive layers, without another layer (in particular active or dielectric); in this context, the first filling and the second filling can be used to form an overall electrical conductor exposed at the level of the first face, and preferably being flush at the level of it.
- In particular, by carrying out a second filling not producing any void in the layers, then by carrying out a removal at the surfaces, for example, by polishing, an electrical contact surface of great quality is obtained. The plurality of layer depositions can also be utilised, with at least two layers respectively coming from the first filling of the second filling, to select the most suitable materials for these two phases;
- the second filling comprises a solid plate deposition of the at least one second material from the first face 11 of the base layer 1 then a polishing configured to expose the first face 11;
- the second filling is configured to totally fill the hollow portion 5;
- the second filling comprises a formation of at least one layer of the at least one second material in the hollow portion, then a formation of a clearance 17 in said at least one layer by forming a closed edge configured to define a stack 16 of a residual portion of the at least one layer circumscribed by the clearance 17;
- the formation of a clearance 17 comprises the definition of a mask 15 above a covered zone of the stack 16 and an engraving configured to remove the at least one layer outside of the covered zone;
- the method comprises an at least partial filling of the clearance 17 by at least one dielectric material;
- the at least partial filling of the clearance 17 comprises at least one solid plate deposition of a first dielectric material 18 then a second dielectric material 19, then a polishing of the second dielectric material 19 using the first dielectric material 18 as a stop layer and configured to expose the first dielectric material 18 above the first face 11, then a removal of at least one part of the first dielectric material 18 situated above the stack 16, so as to expose said stack 16;
- the filling is configured to totally fill the hole 2;
- the at least one second filling material comprises, above the conductive state-changing material layer, at least one layer of material used to form at least one part of a second electrode and wherein the first electrode, the conductive state-changing material and the second electrode form a memory, preferably a resistive non-volatile memory;
- a re-contact element 20 in contact with a surface is formed, exposed on the first face 11, of the at least one second filling material;
- the second element is flush on the first face 11;
- the at least one second filling material comprises, above the conductive state-changing material layer, at least one layer of electrode material forming at least one part of a second electrode, and wherein the first electrode, the conductive state-changing material and the second electrode form a memory, preferably a resistive non-volatile memory.
- the layer of electrode material is flush on the first face;
- the second element is a stack protruding above the first element and circumscribed by a clearance forming a closed edge around the stack;
- the clearance is filled with at least one dielectric material.

It is specified that the term on or "above" does not compulsorily mean "in contact with". Thus, for example, the deposition of a layer on another layer, does not compulsorily mean that the two layers are directly in contact with one another, but this means that one of the layers covers at least partially the other by being either directly in contact with it, or by being separated from it by a film, also another layer or another element. A layer can moreover be composed of several sublayers of one same material or of different materials.

It is specified that the thickness of a layer is measured along a direction perpendicular to the surface according to which this layer has the maximum extension thereof. The width thereof extends transversally to this thickness.

Some parts of the device can have an electrical function. Some are used for electrical conduction properties and by electrode or equivalent, this means elements formed of at least one material having a sufficient conductivity, in the application, to achieve the desired function. Other parts, on the contrary, are used for electrical insulation properties and any material having a sufficient resistivity to achieve this insulation is concerned and in particular, called dielectric.

FIG. 1 illustrates a device constructed on the base of a substrate 0, for example made of silicon, surmounted on a layer 1 which passes through one or more vias 3. In this schematic example, the via 3 is used to electrically connect a connector surface 14 of the substrate 0 to an upper face 11 of the layer 1, for example to connect a component to this place. In FIG. 2, it is observed that the upper surface of the via 3 is exposed and that it can ensure a re-contact at this level. The disadvantages which can pose filling defects of the vias 3 represented in FIGS. 1 and 2 have been indicated above.

Below, in reference to FIGS. 3 to 7, a method making it possible to reduce or to make such defects disappear is presented, at least over some of the height (which extends from the dimension along the thickness of the layer passed through by the via or depth) of the via 3.

Figure 3:
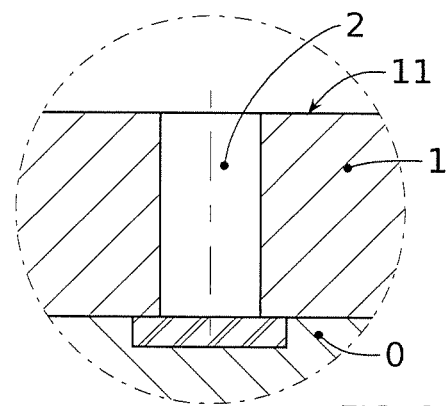

FIG. 3 shows a hole 2 in a base layer 1. This hole 2 leads to the face 11 of the base layer 1 by which it is desired that the via 3 is accessible for a later use. It is not absolutely necessary that the hole 2 leads to the other face of the base layer 1. The hole 2 can be opened later or remain closed and not electrically connected from the bottom, or also be already partially filled at the base thereof by a material which conducts electricity. The hole 2 is, for example, of a circular cross-section, but this is not limiting. It can also, in particular, be of a square or rectangular cross-section. Here, the largest dimension of the hole 3 or of the via 3 in a plane perpendicular to the thickness of the layer 1 is called width or diameter. It is typically the diameter for the case of a circular cross-section or the largest side for a rectangular case, or the dimension of any side in the case of a square cross-section.

The invention does not assume the material of the layer 1; it can, in particular, be silicon dioxide or silicon nitride. The hole 2 can be obtained by a common-type engraving.

Figure 4:
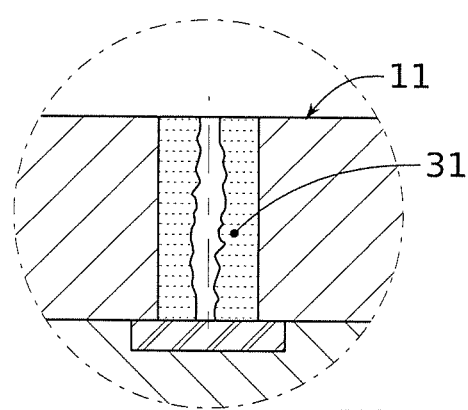

In FIG. 4, a first filling 31 of the hole 2 has been done. This filling 31 can be produced in one or more steps and can involve one or more first filling materials. For example, a titanium nitride layer can be deposited (or two layers, respectively titanium and titanium nitride), then finalise the first filling mainly with tungsten so as to fill the inner volume of the hole 2 as much as possible. Preferably, the filling is done by chemical vapour deposition (CVD). However, other filling methods can be resorted to, complementarily or alternatively to CVD, in particular physical vapour deposition (PVD), for example for a TiN layer. It can be followed by a polishing so as to remove the depositions having covered the face 11 of the layer 1.

The height of the hole, h1, is in the example, quite large relative to the width, l, thereof, if although the shape ratio h1/l is increased (typically greater than 2, and possibly greater even a lot greater than 10), which makes it difficult for a complete filling of the via 3 and, in this case, a void 4 subsists in the material of the first filling, this void sometimes leading to the face 11.

At this stage, a removal of the material of the first filling 31 is carried out. This removal is not complete, but on the contrary, only occurs over some of the depth of the hole from the face 11 of the base layer 1. Advantageously, the removal depth is less than one half, even one third, of the height h1. Advantageously, the depth h2 of removal is selected, which can be seen in FIG. 5, such as the ratio h2/l is less than or equal to 2, even less than 1; it can be greater than or equal to 0.25.

According to an option of the invention, the removal is an engraving. If the first filling was multilayer, it is not compulsory to proceed with a removal of a portion of each of these layers; only the most central part of the via, that at the level or in the proximity of the longitudinal axis thereof, can in particular be engraved. A dry or wet engraving can be suitable, in particular SF6-based to attack the tungsten. An engraving edge can be formed, at the level of the exposed surface 6 of the material of the first filling 31. In this manner, a bowl-shaped hollow portion 5 is favoured, the thickness produced by the first filling decreasing in the direction of the face 11.

Figure 5:
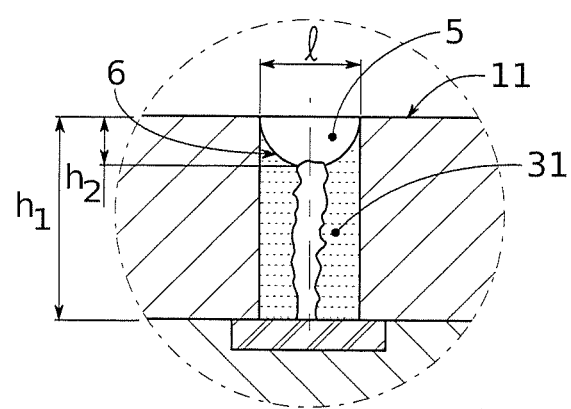

The hollow portion extends from a cavity-shaped part in the hole, but over a height less than that of the hole. In the case of FIG. 5, the removal is progressive in the width from the surface, and here cap-shaped, if although the first filling material subsists on the side edges of the hollow portion, edges having a non-zero component according to the depth of the hole. It is also possible to arrange a hollow portion wall which is directed only along the height of the latter, for example cylinder-shaped, of circular cross-section or not, falling within the hole; the at least one first filling material thus surrounds at least partially this cavity. Another possibility is to totally remove the first filling material over a given depth, if although the hollow portion consists of a complete stage of the original hole. In particular, the bottom of the hollow portion is possibly an upper face, advantageously flat, of the first filling material preserved more in the bottom of the hole.

This removal process, whatever the variant thereof, contradicts with a conventional method for producing vias, since it could appear as counterproductive; however it will be seen that this phase is advantageous.

Indeed, the removal produces a hollow portion 5 of which the height is lower than the initial filling height; and the shape ratio is also preferably reduced. Subsequently, a second filling phase can be carried out, of the hollow portion 5. As in the case of the first filling, it can be a multilayer deposition. A first layer 7 can be a fastening layer favouring a good interface between the exposed material of the first filling 31 and of the subsequent layers of the second filling. If the underlying material was tungsten, for example, the second filling by a fastening layer 7 made of titanium nitride or titanium can be started. Then, the second filling can be followed by a second deposition, for example of tungsten. The second filling can comprise, or consist, of one or more electrically conductive layers of one same material or of different materials.

Figure 6:
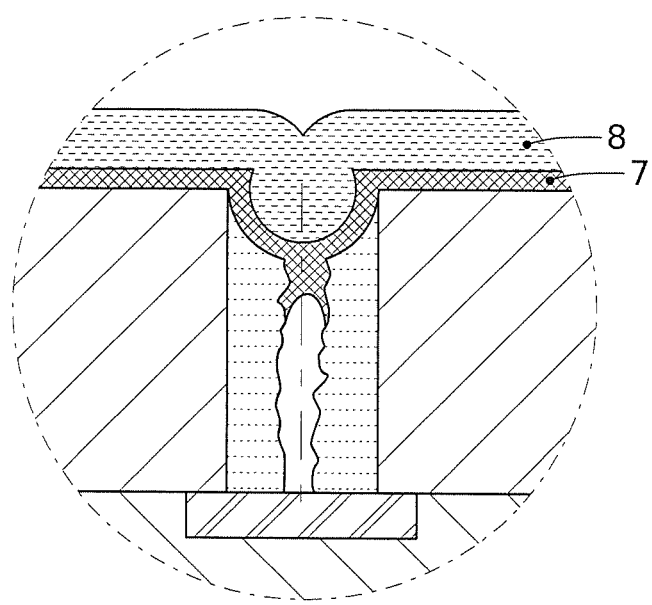

In the case of FIG. 6, it is arrange such that the second filling occupies all the volume of the hollow portion 5 of the hole 2. Given the dimensions brought into play in this second filling phase, the voids are limited, even removed in the zone in question. In addition, the range of deposition techniques is expanded by the fact that the thicknesses of the layers to be formed are thinner. Atomic layer depositions (ALDs) can in particular more easily be resorted to, and because the aspect ratio is lower, physical vapour depositions (PVDs) can in particular be resorted to.

Figure 7:
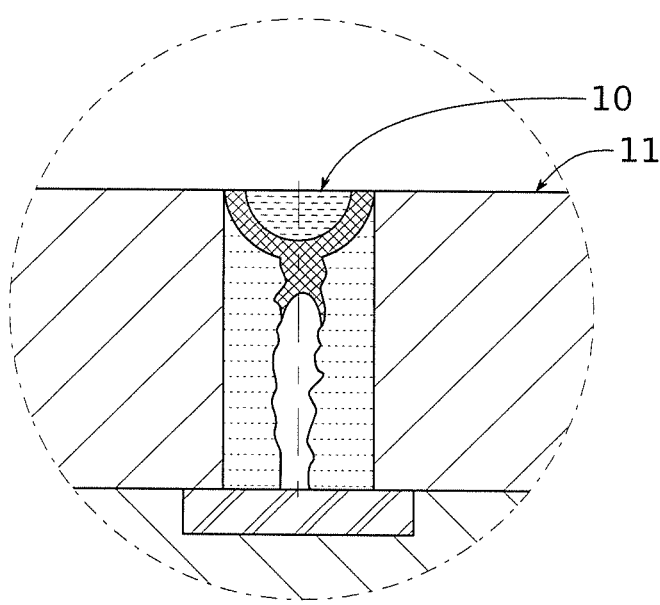

FIG. 7 presents an example of the final result after polishing so as to remove the parts of the depositions which have been able to cover the face 11 of the layer 1. It is understood that the upper face 10 of the via 3 thus finalised is of a better surface state than according to traditional techniques. Advantageously, it has no void.

It will be noted, that the filling can be made homogenous between the first filling phase and the second filling phase, by using at least one identical material during these two phases, and in particular a material occupying a majority of the filling volume of these two phases. This can be the case of tungsten. At least one material can also be used for the second phase, different from the material(s) used in the first phase. The via 3 is found to composite. A main material in volume during the first filling can be different from a main material during the second filling. As examples of materials which can be used for the second filling, also the following materials can be cited: TaN, Ta, Co, Ru, Ni, Cu, HfN, Al, WxTiy, TixAly, TixAlyN, TaxAly, TaxAlyN, materials which are not advantageously found during the first filling.

A via of which the face 10 ensures a better contact with a component to be connected has thus been obtained. In this sense, the via can in particular be used for connection in a "back-end of line" construction approach, or also the electrode, or electrode part, for a component returned by the top of the face 11 of the layer 1, for example an actuator, a sensor, a battery or a memory.

In the latter context, the invention can be used to form at least one part of a memory device. Generally, a memory device can be carried by a support, for example based on a substrate, in particular a semi-conductive substrate. A plurality of devices will generally be produced on this support.

In the initial state, the active material is insulating (in a state called PRS, "Pristine Resistance State"). By active material, this means a material within which a forming phase then conductive (or not) states will be produced as explained below. A first electrical stress is applied on the resistive blank memory in order to generate, for the first time, an LRS ("Low Resistance State"). The associated process is called forming. The resistive memory can then switch from the LRS to an HRS ("High Resistance State") by the application of a first VRESET voltage between the first and second electrodes, and re-switch from the HRS ("High Resistance State") to the LRS ("Low Resistance State") by the application of a second VSET voltage between the first and second electrodes. It can therefore be used to store an item of binary information. The LRS ("Low Resistance State") is also called "ON" state. The HRS ("High Resistance State") is also called "OFF" state.

The resistance change phenomenon is observed in different types of materials, which suggests different functioning mechanisms. Thus, several types of resistive memories can be distinguished. The field in question is more specifically that of two categories of resistive memories:
- the memories comprising an active zone based on an oxide-based active material (OxRRAM or "Oxide RRAM" memory) such as a binary oxide of a transition metal;
- the memories comprising an active zone based on an ionic conductive material (CBRAM or "Conductive Bridging RAM" memories) forming an ionic conduction solid electrolyte arranged between an electrode forming an inert cathode and an electrode comprising an ionisable metal portion, i.e. a metal portion which could easily form metal ions, and forming an anode.

The resistive state change in an OxRRAM type resistive memory is generally explained by the formation of a filament of oxygen deficiencies within the active zone. The resistive state change in a CBRAM type resistive memory is generally explained by the formation of a conductive filament within the active zone.

With the via 3 of FIG. 7, in the case where it forms a conductive element akin to a lower electrode part, the exposed surface of the face 10 of the via 3 is clearly improved relative to prior techniques such that a resistive state change material layer can be stacked there by limiting the dispersion regarding the forming voltage values.

FIGS. 8 and 9 illustrate a variant of the invention in such an application. In FIG. 8, based on the intermediate result illustrated in FIG. 5, a second filling is proceeded with, comprising a succession of layers contributing to a memory. For example, a titanium nitride layer 7 can coat the residual portion of the first filling, for example made of tungsten. Thus, a first memory device electrode is obtained. Then, a layer 9 can be made of an active material, namely resistive state changing material, like $HfO_2$. The filling can be followed with at least one layer 12 and a layer 13 forming or contributing to a second electrode. This can comprise at least one from among a titanium layer, a titanium nitride layer.

FIG. 9 shows a polishing, ensuring the removal of depositions at the surface of the base layer 1.

Of course, re-contact members can then be returned above the via 3.

Figure 10:
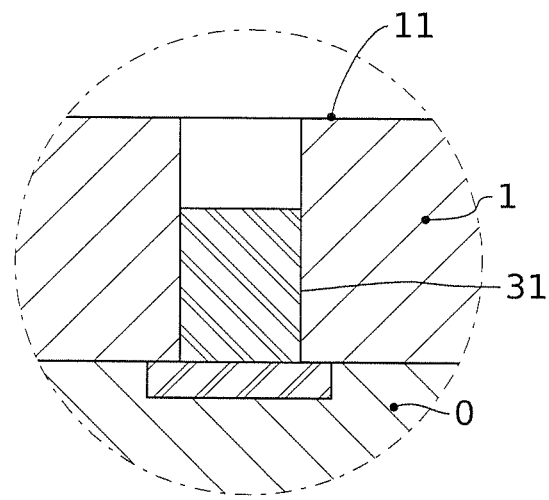

FIG. 10 presents an alternative situation to the case of FIG. 5 concerning the profile of the hollow portion 5. The first filling 31 is here represented more schematically in this sense that the defects that it is likely to present, are not illustrated. Concerning the shape of the hollow portion 5, it corresponds to a complete removal of the material of the first filling 31 according to the depth of the hollow portion 5. The side walls of the hole are therefore thus cleared. In the non-limiting case of a hole with a circular cross-section, the hollow portion corresponds to a cylindrical portion. In another non-limiting case according to which the hole is of a rectangular (even square) cross-section, the hollow portion 5 is rectangularly parallelepiped. This shape configuration can be obtained, for example, with an anisotropic engraving progressively digging the hollow portion equivalently along the whole cross-section of the latter.

It will be noted, that this hollow portion 5 profile can be applied to the embodiments discussed above. Likewise, even if this profile is used in the case of FIGS. 11 to 16, it is not limiting of this embodiment which can resort to other profiles and in particular those discussed above.

Figure 11:
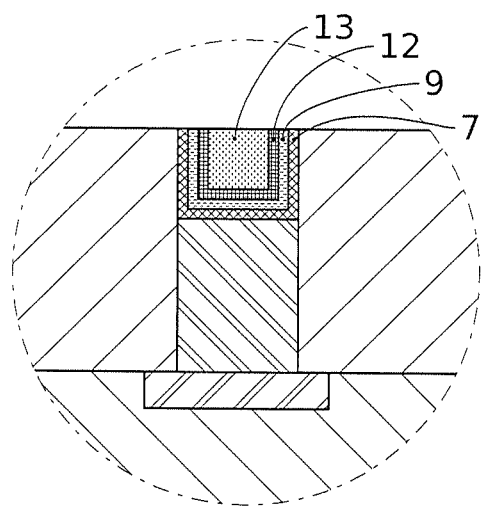

In FIG. 11, the production of a plurality of layers has been carried out in the volume of the hollow portion 5. It can be successive solid plate depositions of a plurality of layers 7, 9, 12 and 13. Any deposition technique, in particular by PVD can be suitable. Advantageously, but in a non-limiting manner, then a polishing is carried out, so as to only preserve the material of the successive layers in the hollow portion and not at the level of the first face 11, which is disclosed in FIG. 11 as the first face 11 remains exposed there; this, however, is not limiting.

As in the preceding case, the second filling passing through the plurality of layers 7, 9, 12 and 13 can be used to form a memory point; in this context, the material of the first filling 31 can always be a conductive element, for example, tungsten, and the layer 7 can be an electrically conductive layer returned above the first filling 31, for example made of TiN. The layer 9 can, as above, be an active layer, for example made of $HfO_2$.

Then, the layers 12 and 13 can form an upper electrode part, made of electrically conductive material such as, respectively, titanium and titanium nitride. It is desirable that the depth and/or the cross-section of the hollow portion 5 and that the thicknesses of the successive layers of the second filling are configured such that all of the layers of the second filling descend towards the inside of the hollow portion such that all the layers comprise a portion comprised in the inner volume of the hole.

The configuration of FIG. 11 is, in this context, quite close to that presented in FIG. 9, apart from the profile of the hollow portion 5. It can be used as a starting point for a re-contact through the top, in particular by ensuring an electrical continuity between the layer 13 is a re-contact element returned at the level of the first face 11.

However, it is advantageous to facilitate the re-contact by increasing the individualisation of the upper surface of the second element constituted by the layers of the second filling, in particular, by avoiding the layers underlying the upper layer (here the layer 13) being exposed at the level of the first face 11. Furthermore, the memory point can be made very small.

Figure 12:
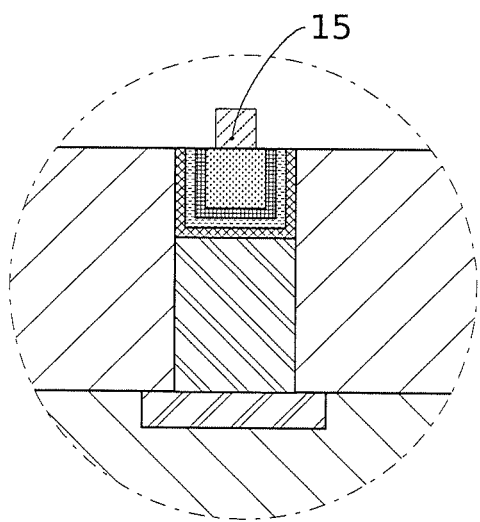

To this end, FIGS. 12 to 16 show successive steps leading to further distinguishing the upper conductive part of the second filling, filling at least partially the hollow portion 5, relative to the other layers of this second filling. In the step of FIG. 12, a mask 15 has been defined above the second filling, so as to cover a zone, and preferably not all of the exposed surface of the last layer of the second filling, here the layer 13. Advantageously, the mask 15 is defined to not cover other layers. A photolithography technique can be suitable in this context.

Figure 13:
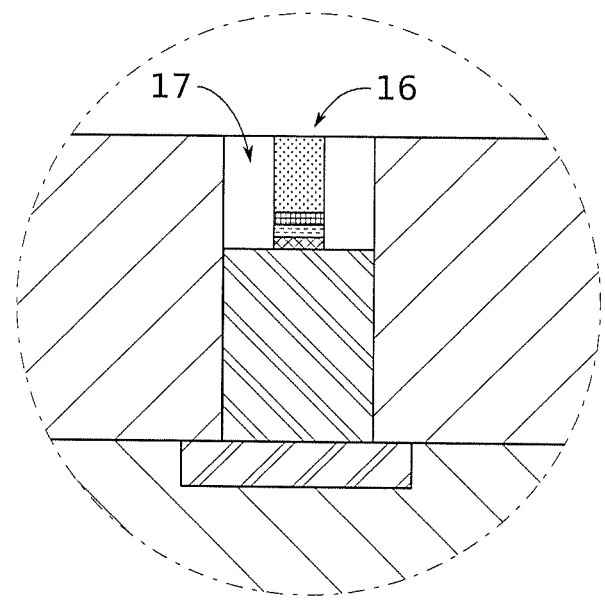

The mask 15 is used to spare the zone that it covers during a step of removing the material(s) of the second filling. Thus, FIG. 13 shows the result of an engraving done in the second filling so as to only conserve the layers of the latter below the mask 15 (the latter has been removed after the engraving step and no longer appears in FIG. 13). It is desirable that the engraving is highly anisotropic. A plasma engraving can in particular be used. Preferably, the removal produced is followed up to the upper face of the first filling 31, by engraving along the whole depth of the hollow portion 5. Furthermore, given that the mask 15 only advantageously protects one part of the second filling, the removal leads to the definition of the clearance forming a closed edge in the cross-section equivalent to the shape of the mask 15 around a residual portion of the layers of the second filling below the mask 15. In the case of FIG. 13, this residual portion corresponds to a stack 16 which protrudes from the upper face of the first filling 31 and, in this example, up to the level of the first face 11. It is understood that the shape of the clearance 17 is determined by the shape of the mask and the shape of the mouth of the initial hole. Moreover, it is understood that the stack 16 forms an island in the hollow portion 5. This individualisation will make it possible for an improved re-contact while enabling a small dimension of the memory cell.

Figure 14:
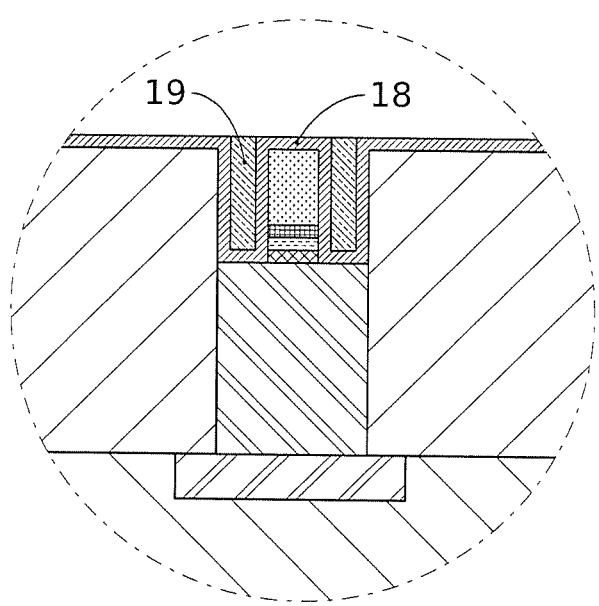

In FIG. 14, the stack 16 is encapsulated by a dielectric solid filling. The latter comprises, in the example, a first dielectric material 18, for example SiN, SiC or SiCN, which lines the first surface 11, the side wall of the hollow portion 5, the exposed upper surface of the first filling 31 and the upper surface of the stack 16 as well as the side wall thereof. It will be noted that this covering preferably makes it possible to protect the layers of the stack 16 of the oxidation, in particular concerning the use of materials which are quite highly oxidisable, such as titanium. The filling done by the first material 18 can itself be sufficient, for example made of $SiO_2$. Moreover, it is not absolutely necessary that the filling is complete in the clearance. However, in the embodiment of FIG. 14, the first material 18 has been completed by a second dielectric material 19, for example $SiO_2$. In the case of SiN in particular, for the first material 18, a layer can be produced by PECVD (plasma-enhanced chemical vapour deposition). In the case of $SiO_2$ in particular, for the second material 19, a layer can be produced by PECVD. Preferably, the clearance 17 is completed filled. Then, a polishing can be done so as to remove the dielectric material 19 at the surface. It is the resulting state which is presented in FIG. 14.

Figure 15:
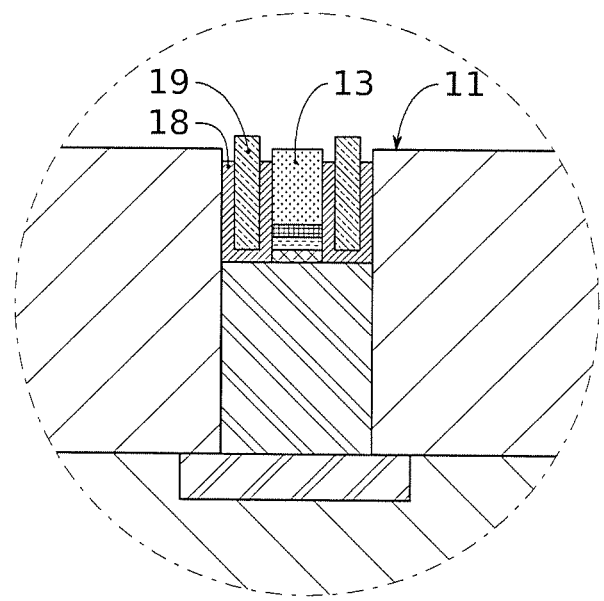
Figure 16:
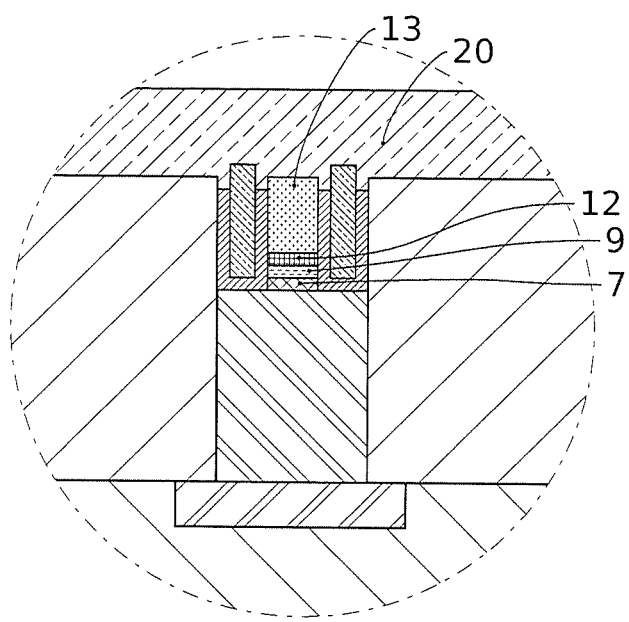

At this stage, the first dielectric material 18 also covers the stack 16 and the face 11. A selective engraving, for example dry engraving (or possibly wet engraving), of this material is this controlled so as to remove the part of the first dielectric material 18 above the stack 16 while preferably preserving the first dielectric material below the surface thus exposed of the stack 16, as FIG. 15 shows. It is understood from this figure that the upper layer of the stack 16 is easily accessible for a re-contact. In particular, it can be a layer 13 contributing to a second electrode which can thus be connected to a re-contact element 20 as FIG. 16 shows. The latter can be a metal element or another electrically conductive material, in the form of a cone or of a line for example, extending over a portion of the first face 11 potentially larger than the stack 16. There is therefore no size constraint in the formation of the re-contact 20.

REFERENCES

0. Substrate
1. Base layer
2. Hole
3. Via
4. Void
5. Hollow portion
6. Surface of the first filling
7. First layer
8. Second layer
9. Active layer
10. Exposed surface
11. Face
12. Layer
13. Layer
14. Connector surface
15. Mask
16. Stack
17. Clearance
18. First dielectric material
19. Second dielectric material
20. Re-contact element
31. First filling

The invention claimed is:

1. A method for producing a via through a base layer of a microelectronic device, the method comprising:
    a formation of a hole in a first face of the base layer and a filling of the hole with at least one first filling material thereby forming an element which conducts electricity, the method comprising an at least partial removal of the at least one first filling material over a depth, directed along a thickness dimension of the hole from the first face of the base layer, the depth being less than the thickness dimension of the hole so as to produce a hollow portion, and the method comprising a second at least partial filling of the hollow portion with at least one second filling material, the second filling thereby forming at least one electrically conductive layer immediately above the element which conducts electricity, wherein the second filling comprises a formation of at least one layer of the at least one second filling material in the hollow portion, then a formation of a clearance in said at least one layer to define a stack of a residual portion of the at least one layer circumscribed by the clearance.

2. The method according to claim 1, wherein the removal is configured such that the hollow portion has a shape ratio, corresponding to a ratio of a depth of the hollow portion t a width of the hollow portion, the shape ratio of the hollow portion being less than a shape ratio of the hole.

3. The method according to claim 1, wherein the removal is configured such that the hollow portion has a shape ratio, defined as a ratio of a depth of the hollow portion to a width of the hollow portion, that is less than or equal to 2.

4. The method according to claim 1, wherein the removal is configured to obtain a thickness of the at least one first filling material decreasing in a direction of the thickness dimension of the hole from the first face, such that the hollow portion is bowl-shaped.

5. The method according to claim 1, wherein the at least one second filling material comprises at least two successive layers of materials which are different from one another.

6. The method according to claim 1, wherein the second filling comprises a solid plate deposition of the at least one second filling material on the first face of the base layer, then a polishing configured to expose the first face.

7. The method according to claim 1, wherein the second filling is configured to totally fill the hollow portion.

8. The method according to claim 1, wherein the formation of the clearance comprises a definition of a mask above a covered zone of the stack and an engraving configured to remove the at least one layer of the at least one second filling material outside of the covered zone.

9. The method according to claim 1, comprising an at least partial filling of the clearance by at least one dielectric material.

10. The method according to claim 9, wherein the at least partial filling of the clearance comprises at least one solid plate deposition of a first dielectric material, then at least one solid plate deposition of a second dielectric material, then a polishing of the second dielectric material using the first dielectric material as a stop layer, the at least partial filling of the clearance being configured to expose the first dielectric material above the first face, then remove at least one part of the first dielectric material situated above the stack, so as to expose said stack.

11. The method according to claim 1, wherein the filling of the hole is configured to totally fill the hole.

12. The method according to claim 1, wherein the at least one first filing material forms at least one part of a first electrode, wherein the at least one second filling material comprises a layer of a conductive state-changing material and the at least one second filling material comprises, above the conductive state-changing material layer and opposite the first electrode, at least one material layer forming at least one part of a second electrode, and wherein the first electrode, the conductive state-changing material, and the second electrode form a memory.

13. The method according to claim 1, wherein the removal is configured such that the hollow portion has a shape ratio, defined as a ratio of a depth of the hollow portion to a width of the hollow portion, that is less than or equal to 1.

14. A method for producing a via through a base layer of a microelectronic device, the method comprising:

a formation of a hole in a first face of the base layer and a filling of the hole with at least one first filling material thereby forming an element which conducts electricity, the method comprising an at least partial removal of the at least one first filling material over a depth, directed along a thickness dimension of the hole from the first face of the base layer, the depth being less than the thickness dimension of the hole so as to produce a hollow portion, and the method comprising a second at least partial filling of the hollow portion with at least one second filling material, the second filling thereby forming at least one electrically conductive layer immediately above the element which conducts electricity, wherein the at least one first filling material comprises a material, different from the at least one second filling material.

* * * * *